US006441509B1

(12) United States Patent
Miller

(10) Patent No.: US 6,441,509 B1
(45) Date of Patent: Aug. 27, 2002

(54) CONTROLLER FOR BATTERY-OPERATED VEHICLE

(75) Inventor: David Miller, Newcastle upon Tyne (GB)

(73) Assignee: Sevcon Limited, Tyne & Wear (GB)

( * ) Notice: Subject to any disclaimer, the term of this patent is extended or adjusted under 35 U.S.C. 154(b) by 0 days.

(21) Appl. No.: 09/571,224

(22) Filed: May 16, 2000

Related U.S. Application Data

(63) Continuation of application No. PCT/GB98/03473, filed on Nov. 18, 1998.

(30) Foreign Application Priority Data

Nov. 20, 1997 (GB) .............................................. 9724597

(51) Int. Cl.⁷ .............................................. B60L 11/18
(52) U.S. Cl. ...................................... 307/9.1; 361/760
(58) Field of Search ................................ 307/9.1, 10.1, 307/147; 361/709–711, 717–720, 783, 760, 781, 777

(56) References Cited

U.S. PATENT DOCUMENTS

| | | | | |
|---|---|---|---|---|
| 4,626,750 A | * | 12/1986 | Post ............................. | 318/139 |
| 5,040,097 A | * | 8/1991 | Stribel ......................... | 361/395 |
| 5,281,900 A | * | 1/1994 | Park ............................. | 318/139 |
| 5,497,289 A | * | 3/1996 | Sugishima et al. ......... | 361/709 |
| 5,602,451 A | * | 2/1997 | Kohge et al. ................ | 361/717 |
| 5,608,617 A | * | 3/1997 | Morrison et al. ........... | 363/147 |
| 5,610,449 A | * | 3/1997 | Takahashi et al. .......... | 361/749 |
| 5,617,307 A | * | 4/1997 | Guigueno .................... | 361/728 |
| 5,623,191 A | * | 4/1997 | Wieloch ....................... | 318/801 |
| 5,715,141 A | * | 2/1998 | Karlsson ..................... | 361/707 |
| 5,751,063 A | * | 5/1998 | Baba ........................... | 361/719 |
| 5,889,378 A | * | 3/1999 | Hayashi ....................... | 318/541 |
| 5,907,475 A | * | 5/1999 | Babinski et al. ............. | 361/719 |
| 5,914,860 A | * | 6/1999 | Janko ........................... | 361/710 |
| 6,111,328 A | * | 8/2000 | Ota et al. .................... | 307/147 |
| 6,147,869 A | * | 11/2000 | Furnival ..................... | 361/719 |
| 6,215,681 B1 | * | 4/2001 | Schuurman et al. ........ | 363/141 |

FOREIGN PATENT DOCUMENTS

| | | | | |
|---|---|---|---|---|
| DE | 4412407 | * | 10/1995 | ........... B60L/11/18 |
| EP | 0766504 | * | 4/1997 | ............ H05K/1/14 |
| GB | 2288497 | * | 10/1995 | ............ H02P/7/00 |
| GB | 2312342 | * | 10/1997 | ............ H02M/7/00 |
| GB | 2331641 | * | 5/1999 | ............ H02P/1/00 |
| WO | WO 91/15379 | * | 10/1991 | ........... B60L/11/18 |
| WO | WO 99/26806 | * | 6/1999 | ........... B60L/11/18 |

* cited by examiner

*Primary Examiner*—Fritz Fleming
(74) *Attorney, Agent, or Firm*—Hodgson Russ LLP

(57) ABSTRACT

A controller, for a battery-operated vehicle or the like, comprises a plurality of mosfet/diode/capacitor circuits. A printed circuit board (PCB) has the mosfet/diode/capacitor circuits arranged in four sets, one set along each side of the board, and with the inner areas of the board on both sides and the outer area on at least one side being substantially solid tracking areas forming the connections to the circuits. The connectors (A, B+, B−) to circuits are located substantially along a diagonal of the board, with the connectors (A and B+) to the two sides of the diodes located at opposite corners of the inner areas of the board. The inner tracking areas are divided by isolating lines into separate fingers for the respective circuits. The mosfet and diode of each circuit are mounted on one side of the board and the capacitor on the other, with a heat sink bar located between the mosfet and diode with the mosfet and diode clamped to it by a nut and bolt passing through lugs on the mosfet and diode each a matching hole in the bar.

22 Claims, 5 Drawing Sheets

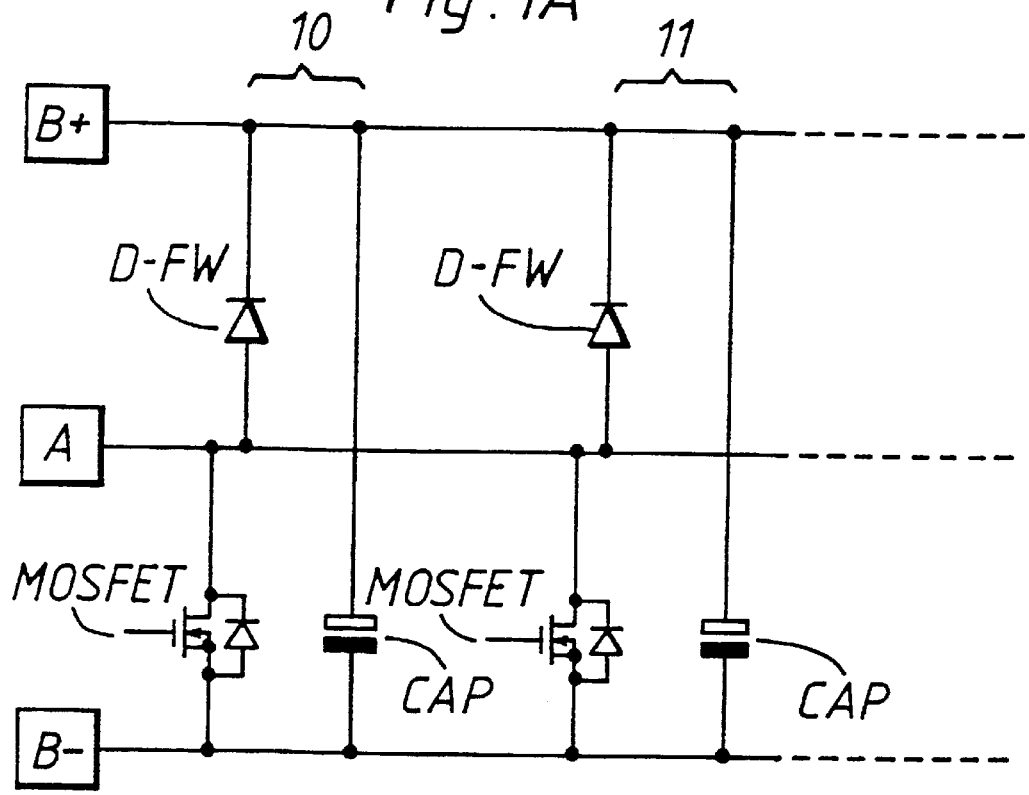
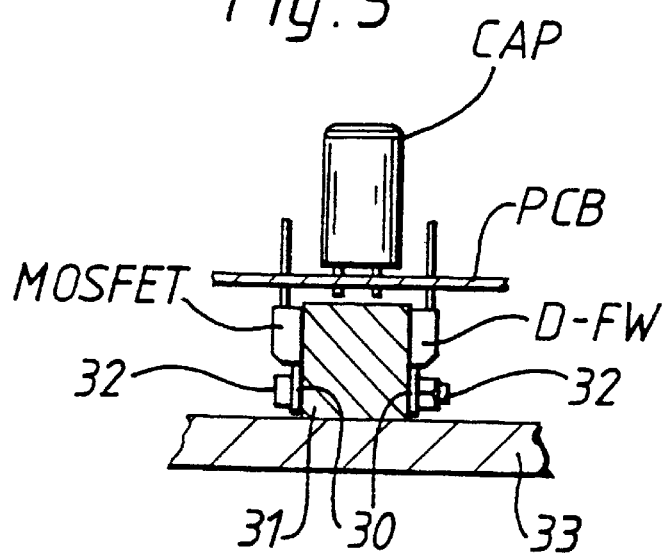

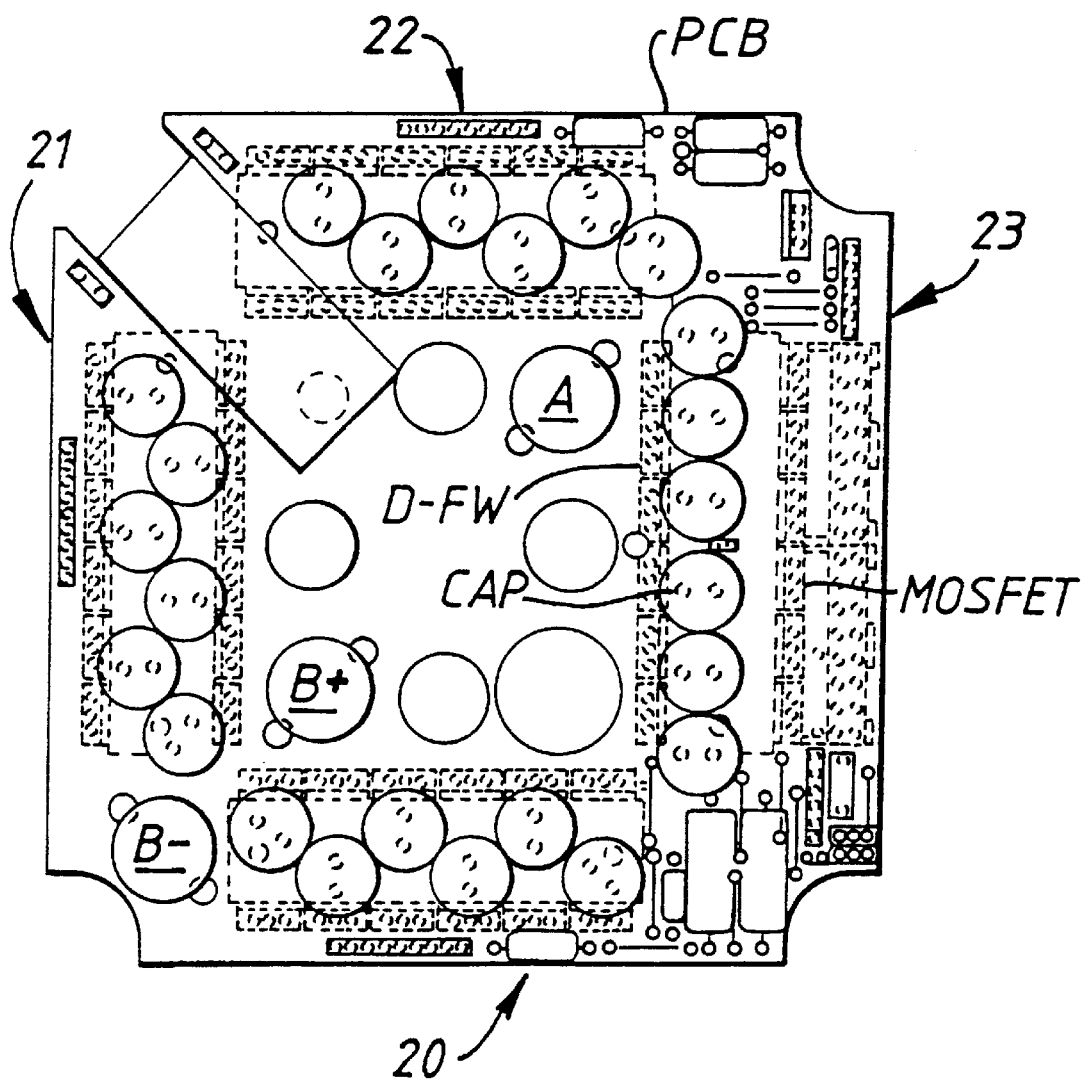

CONTROLLER FOR BATTERY-OPERATED VEHICLE

CROSS REFERENCE TO A RELATED APPLICATION

This application is a continuation of International Application No. PCT/GB98/03473 filed Nov. 18, 1998.

BACKGROUND OF THE INVENTION

The present invention relates to a power controller, for example a controller for a motor in a battery-operated vehicle. Such controllers typically have to switch large currents at low voltages (eg currents of the order of 500 A at 24 V or 48 V), and typically use control circuit comprising a bank of switching elements, and a capacitor. A first switching element may be a MOSFET transistor and a second switching element a diode (i.e. a passive switching element); alternatively, both switching elements may be MOSFET transistors. It will of course be realized that such controllers may also have application beyond battery-operated vehicles, in other situations in which large currents have to be controlled.

SUMMARY OF THE INVENTION

An object of at least the preferred embodiments of the present invention is to minimize the size and cost of such controllers.

According to one aspect of the invention there is provided a power controller, comprising a plurality of switching circuits each consisting of a first switching element, a second switching element, and a capacitor, and a printed circuit board having the switching circuits arranged around an inner area of the board in a partial or complete loop, the inner area of the board and the area outside the loop (the outer area) being substantially solid tracking areas forming the sole connections to the switching circuits.

The inner area on both sides of the board and the outer area on at least one side may form the connections to the circuits.

The switching circuits may be arranged in four sets, each set parallel to a respective edge of the board.

Preferably the connectors to circuits are located substantially along a diagonal of the board, with the connectors to the two sides of the diodes located at opposite corners of the inner areas of the board. The parts of at least one of the tracking areas adjacent to the circuits are preferably divided by isolating lines into separate fingers for the respective circuits.

According to another aspect of the invention there is provided a power controller, comprising a switching circuit consisting of a first switching element, a second switching element, and a capacitor, mounted on a printed circuit board with the first and second switching elements mounted on one face of the board and the capacitor on the other.

Preferably a heat sink is located between the switching elements to receive heat therefrom. There may be means mechanically fixing the switching elements to each other via the heat sink. Thus the switching elements may be clamped to the heat sink, preferably by a nut and bolt passing through lugs on the switching elements and a matching hole in the heat sink, which may be of bar-like configuration. There may be a plurality of switching circuits arranged in a row with a common heat sink. A heat dissipating element eg. a plate substantially parallel to the printed circuit board may be attached to the heat sink.

A controller embodying the invention will now be described, by way of example, with reference to the drawings, in which:

BRIEF DESCRIPTION OF THE DRAWINGS

FIG. 1A is a circuit diagram of a part of the circuit of FIG. 1;

FIG. 2 is a plan view of a printed circuit board layout showing the components;

FIG. 5 is a partial sectional view through the printed circuit board with its components mounted on it.

DETAILED DESCRIPTION OF THE INVENTION

General Background

Figure 1:
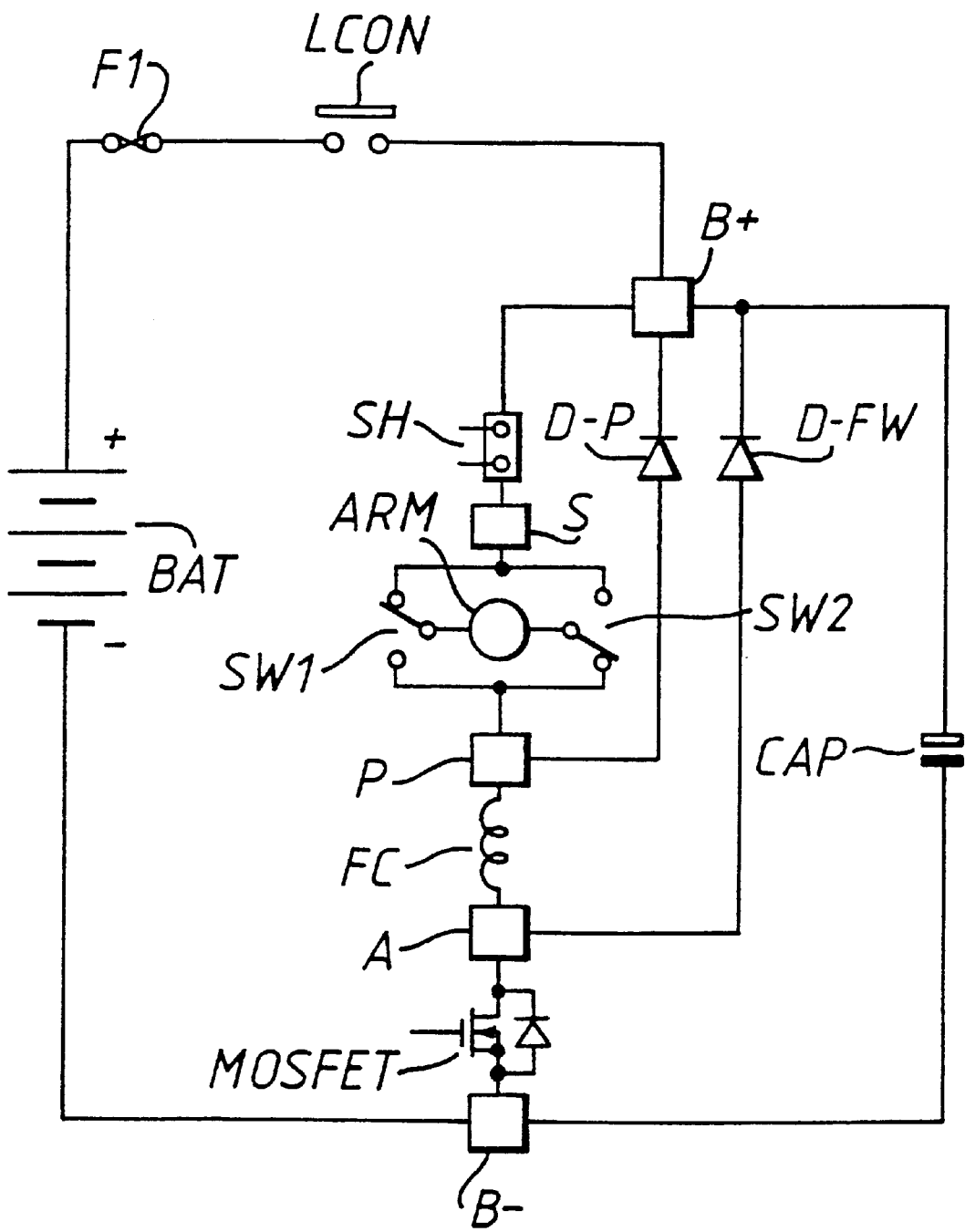
FIG. 1 is a simplified circuit diagram of a vehicle circuit for a series motor, including the controller.

FIG. 1 is a simplified circuit of a battery-operated vehicle. A battery BAT drives a motor consisting of an armature ARM and a field coil FC via a switch formed by a mosfet transistor MOSFET. The main current path from the battery includes a main fuse F1, a line contactor LCON, and a shunt SH by means of which the current flowing through the motor can be monitored. The armature ARM is connected in the current path by means of a pair of contactors SW1 and SW2 which form a reversing switch. A plug diode D-P is connected across the armature as shown, a freewheel diode D-FW is connected across the motor (armature and field coil) as shown, and a capacitor CAP is connected across the motor and mosfet as shown. The mosfet switch is controlled by a PWM or chopper signal applied to its gate which repeatedly turns it on and off. The ratio of on-time to off time (mark/space ratio) regulates the average current supplied to the motor, and thus enables it to be controlled, as known per se.

Functionally, the diode D-FW, the capacitor CAP, and the mosfet MOSFET are each a single unit. However, for various reasons it is often desirable or necessary to achieve the relevant functions (particularly the total current—handling capacity) by means of banks of individual components connected in parallel, so there are banks of mosfets, freewheel-diodes, and capacitors. More specifically, these banks match each other; in other words, they can be regarded as a single bank of mosfet/freewheel-diode/capacitor circuits each consisting of a mosfet, a freewheel diode, and a capacitor.

Each mosfet may incorporate a shunt diode between its source and drain. However, such shunt diodes do not affect the principles considered here, and (if present) will therefore be ignored.

The plug diode D-P may also consist of a number of physical diodes in parallel, but the number of diodes in this bank need not match the numbers of mosfets, freewheel-diodes, or capacitors, and the plug diode circuitry is largely independent of the mosfet/freewheel-diode/capacitor circuitry. The plug diodes can therefore be ignored from here on.

Controller Objectives

There are two major objectives in controller design; low cost and small size. The desirability of low cost is obvious.

Small physical size is also desirable, as it increases flexibility and freedom in locating it in a convenient position in the vehicle.

To achieve these objectives, the number of mosfets should be minimized. Since the size of the current to be controlled is determined by the motor, that means that the current capacity of the individual mosfets must be maximized. For a given size, the lower the breakdown voltage VBD of a mosfet is, the lower its specified on-state resistance is, and hence the higher the current it can carry for a given power dissipation. So the breakdown voltage of the mosfets should be as small as possible.

The breakdown voltage of the mosfets must obviously be greater than the maximum voltage which can be imposed on them. When the mosfets are switched off, a voltage spike or overswing above the battery voltage is generated. Apart from the battery voltage and voltages generated by braking, which are generally determined by outside factors, the transient spike or overswing is the major factor determining the voltage which the mosfets must withstand, and thus the minimum breakdown voltage.

Controller Structure

Returning to FIG. 1, the main circuit path includes a number of major connector points: B+, S, P, A, and B−. In the present system, the bank of mosfet/-diode/capacitor circuits is connected to the three connectors A, B+, and B−. FIG. 1A shows diagrammatically the arrangement of the bank of mosfet/diode/capacitor circuits. The connectors B+, A, and B− are effectively connected to respective buses, and the various individual mosfet/diode/capacitor circuits 10, 11, etc are connected in parallel across these buses.

The size of the voltage overswing generated when a mosfet is switched off is dependent on the inductance of the loop formed by the mosfet and its associated diode and capacitor, and also on the interaction between different loops, including in particular the inductance of mosfet-mosfet-capacitor paths. To minimize the inductances, the sizes of the loops should be minimized; and to minimize the interactions, the mosfet/freewheel-diode/capacitor circuits should be matched as far as possible.

The Present System

In the present system, the bank of mosfet/freewheel-diode/capacitor circuits is mounted on a printed circuit board which is coupled to the remainder of the circuit by means of the three connectors A, B+, and B−. (The plug diodes D-P can also be mounted on the printed circuit board PCB if desired; but, as noted above, the plug diode circuitry is largely separate from the mosfet/freewheel-diode/capacitor circuitry.) The PCB, ie the combination of the mosfet/diode/capacitor circuits, is effectively the controller.

FIG. 2 is a general view of the PCB showing the arrangement of the components thereon, the connection points for the components, and the positions of the connectors A, B+, and B−. The PCB is approximately in the form of a square. There are twenty four mosfet/diode/capacitor circuits arranged in four sets of six, with the four sets occupying the four sides 20 to 23 of the square. The fourth mosfet/diode/capacitor circuit down on the right-hand side of the square, indicated as MOSFET, CAP, and D-FW, is typical of the mosfet/diode/capacitor circuits. As shown, the diodes are located on the inside of the square, the capacitors outside the diodes, and the mosfets outside the capacitors. The mosfets each have three terminals and the capacitors each have two terminals. Each diode is shown as having three terminals, because each diode in fact consists of a pair of diode elements in a single casing; the circuitry on the PCB connects the two elements in parallel so that they effectively form a single diode.

The largest components are the capacitors. To minimize the size of the PCB, the mosfets are located substantially contiguous with each other along each side of the square, as are the diodes. On sides 20 to 22 of the square, the capacitors are staggered in a zig-zag arrangement as shown to pack them into the same length as the diodes and mosfets. On side 23, the capacitors are in a straight line, and are therefore slightly offset from their associated diodes and mosfets. However, the spacing between the diodes and the mosfets is the same on all four sides of the PCB, for reasons discussed later.

Figure 3:
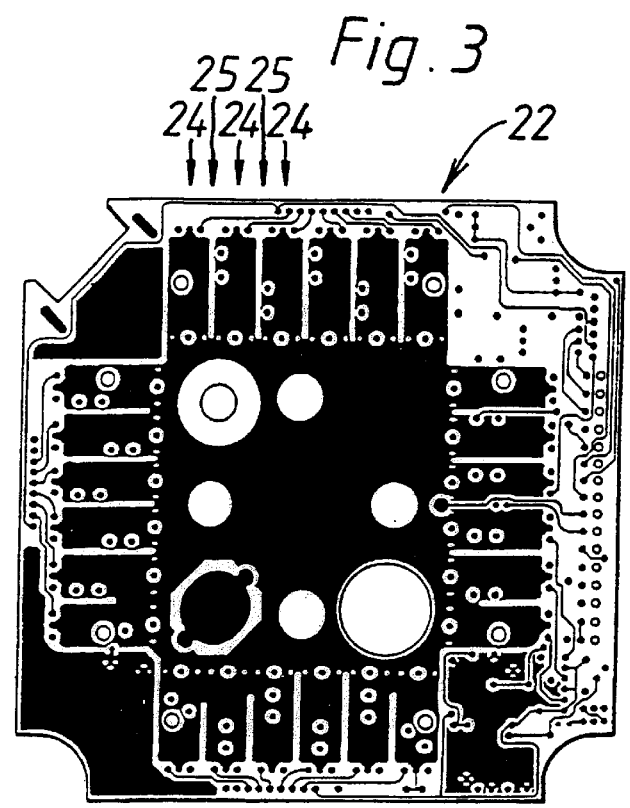
FIGS. 3 and 4 are plan views of the tracking on the two sides of the printed circuit board.
Figure 4:
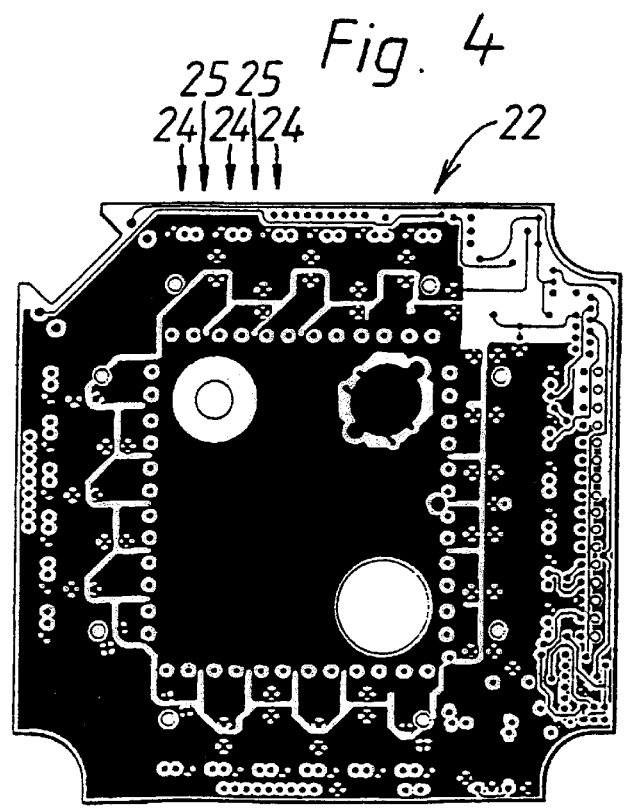

The three connectors A, B+, and B− are arranged along the lower left to upper right diagonal of the square, as shown, with the A and B+ connectors at opposite comers of the area inside the four sets of mosfet/diode/capacitor circuits and the B− connector at an outer comer. FIGS. 3 and 4 show the track patterns on the two sides of the PCB. FIG. 3 shows the upper surface of the PCB; the A connector is connected to a solid area of track in the inside of the square. FIG. 4 shows the lower surface of the PCB (from the top, ie looking through the PCB); the B connector is connected to a solid area of track in the inside of the square and the B− connector is connected to the solid area of track on the outside of the square (and the B− connection also uses parts of some of the outside corners of the top surface of the PCB, as shown in FIG. 3).

The areas of track for the A, B+, and B− connections form the buses shown in FIG. 1A. The fact that these track areas are solid means that their current carrying capacity is high, and the tracks can be made of heavy copper of sufficient thickness (using conventional PCB technology) to provide adequate capacity to carry the currents which the mosfet/diode/capacitor circuits have to carry. Thus the present controller does not require conventional busbars. The control connections to the mosfets, and various auxiliary circuitry, are accommodated around the outer edge of the upper surface (FIG. 3) of the PCB.

Looking at FIG. 3, the central area of the inner square of track is solid apart from various holes which accommodate mounting bolts, the B+ connector, etc. This central area extends outwardly across the four sets of six mosfet/diode/capacitor circuits in the form of four sets of six fingers separated by isolating lines; three of the fingers on the top side 22 are shown at 24 together with the two isolating lines 25 separating those fingers. This division of the conductive area into distinct fingers, one for each mosfet/diode/capacitor circuit, effectively isolates the mosfet/diode/capacitor circuits from each other, minimizing interactions between adjacent mosfet/diode/capacitor circuits. It will be noted that the isolating lines are shortened in the bottom corners of the inner square, to improve the current flow around the large holes in the inner tracking area in those corners.

The B+ tracking area in the inside of the square, shown in FIG. 4, has similar fingers 24 separated by isolating lines 25, though these fingers do not need to extend as far as the fingers of the B− tracking area shown in FIG. 3. (The fingers are of alternating lengths along sides 20 to 22, matching the side-to-side staggering of the capacitors on those sides). No separate of the A tracking area (around the outside of the square as shown in FIG. 4) for the different mosfet/diode/capacitor circuits is required. If desired, an additional B− connector may be provided at the opposite (top right) corner of the board, or three such additional connectors so that there is a B− connector at each corner of the board.

The generally square layout of the mosfet/diode/capacitor circuits (rather than a linear layout of a single line, or two parallel lines) results in good packing density, short current paths between the connectors and the mosfet/diode/capacitor circuits, and greater uniformity of the current paths to the different mosfet/diode/capacitor circuits. The placing of all the connectors on a common diagonal of the square, and the placing of the A and B+ connectors at opposite points along that diagonal, also promotes greater uniformity of the current paths to the different mosfet/diode/capacitor circuits and uniformity of heating of the different mosfet/diode/capacitor circuits. We have found that moving the terminals away from the positions shown progressively degrades the current sharing and increases differential heating.

In principle, the layout need not be a square; a hexagonal or circular layout would have similar properties. In fact, for equalization of the current paths between the A and B+ connectors, an elliptical layout with those connectors as foci would be optimal. However, a square layout has considerable other advantages.

The mosfets and diodes carry high currents, and therefore need cooling. The cooling arrangement of the present controller is shown in FIG. 5, which is a section through the PCB in the region containing a single mosfet/diode/capacitor circuit. The mosfet and the diode are mounted on one side of the PCB, while the capacitor is mounted on the opposite side. This physical arrangement of the three elements of each mosfet/diode/capacitor circuit also facilitates keeping the physical size, and hence the inductance, of the circuit small.

The mosfet and the diode are of similar size and shape, and each has a lug 30 extending downwardly from the end opposite the leads. A bar 31 of aluminum or other heat-conducting material (seen in cross-section) is placed between mosfet and the diode. This bar has a hole (not shown) aligned with the lugs 30, and a nut and bolt 32 are placed through this hole and the lugs 30 and tightened to bring the mosfet and diode into good thermal contact with the bar 31. A plate 33 of aluminum or other heat-conducting material is bolted fixed to the bottom sides of the bars 31 to form the final heat-dissipating element.

There are four sets of mosfet/diode/capacitor circuits, each containing six circuits. A separate bar 31 is used for each such set, with each bar being common to all six circuits in the set. The spacing between the mosfets and the diodes is the same for each set, so that the bars can be the same for all the sets. Since each nut and bolt 32 engages with two components (the mosfet and the diode), located generally symmetrically one on each side of the bar, the holes in the bar can be plain untapped drilled bores.

Obviously, this heat-dissipating construction can be used for a single set of such circuits, or even for a single such circuit, if the number of such circuits is low.

Figure 6:
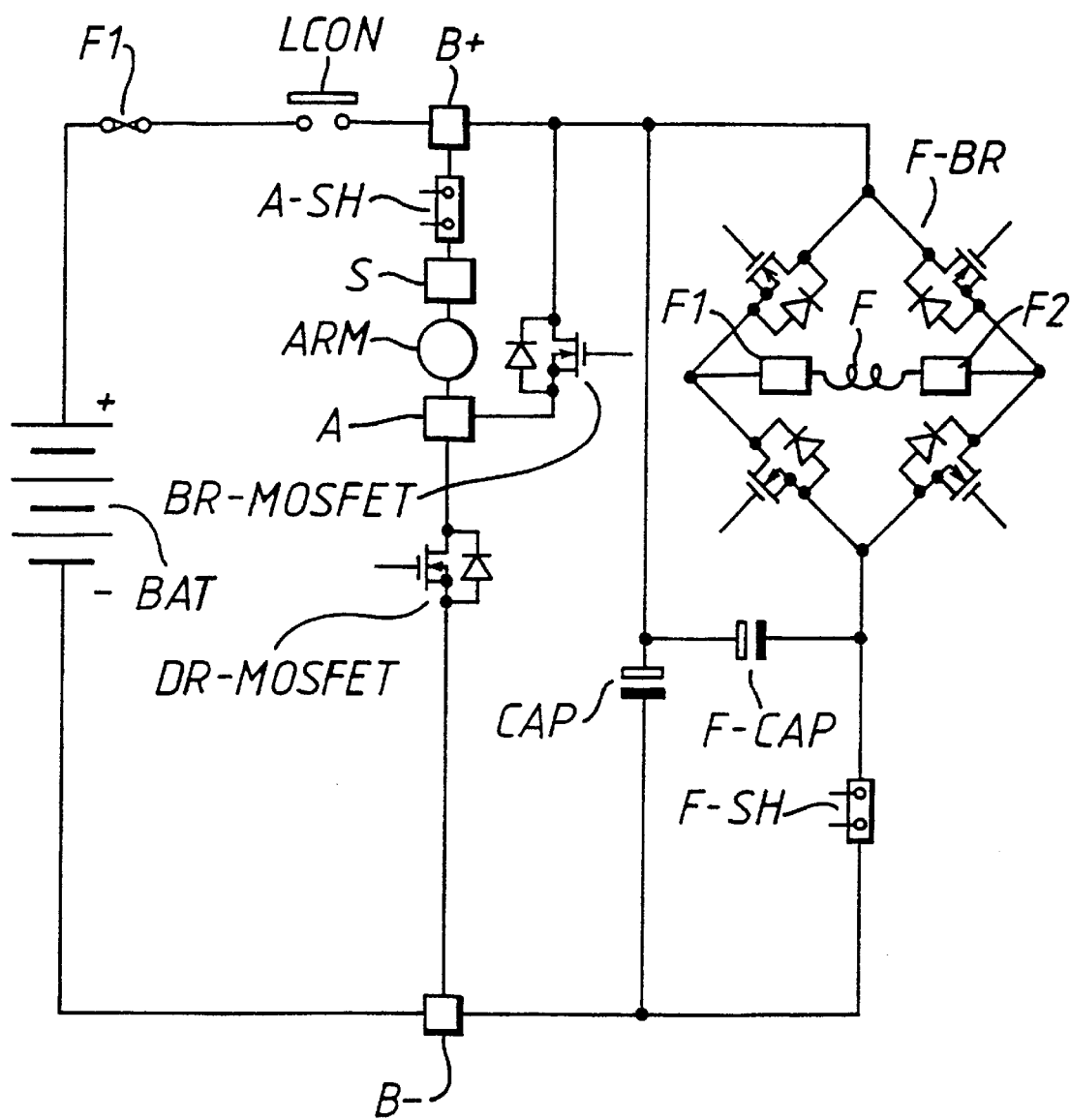
FIG. 6 is a simplified circuit diagram of a further electric vehicle propulsion circuit including a controller for a separately excited motor.

FIG. 6 shows a second vehicle circuit, using an SEM (separately excited motor) configuration. This circuit is broadly similar to the circuit of FIG. 1. However, instead of the armature being in series with the field coil and driven via a bridge, the armature and field coil are in parallel and the field coil F is excited via a mosfet bridge F-BR; also, there are separate shuts A-SH and F-SH for the armature and field coil, and a capacitor bank F-CAP for the field coil circuity. Further, the bank of mosfet/diode/capacitor switching circuits of FIG. 1 is replaced by a bank of mosfet/diode/capacitor switching circuits, consisting of drive mosfets DR-MOSFET, braking mosfets B-MOSFET, and capacitors CAP. That is, the diodes of the FIG. 1 circuit are replaced by braking mosfets.

Each feature disclosed in this specification (which term includes the claims) and/or shown in the drawings may be incorporated in the invention independently of other disclosed and/or illustrated features.

What is claimed is:

1. A power controller having a switching circuit comprising a first switching element, a second switching element, and a capacitor, mounted on a printed circuit board with the first and second switching elements mounted adjacent each other on one face of the board and the capacitor on the other face of the board.

2. A controller according to claim 1, wherein the capacitor is mounted between the first and second switching elements.

3. A controller according to claim 1 including a heat sink located between the switching elements to receive heat therefrom.

4. A controller according to claim 3 comprising means mechanically fixing the switching elements to each other via the heat sink.

5. A controller according to claim 4 wherein each switching element has a lug with a hole in it and the fixing means passes through those holes and a matching hole in the heat sink.

6. A controller according to claim 3 wherein there are a plurality of switching circuits arranged in a row with a common heat sink.

7. A controller according to claim 3 wherein the heat sink is a bar.

8. A controller according to claim 3 including a heat dissipating element extending from the heat sink substantially parallel to the printed circuit board.

9. A controller according to claim 1 wherein the first switching element is a mosfet and the second switching element is a diode.

10. A controller according to claim 1 wherein all the switching elements are mosfets.

11. The controller as claimed in claim 1 in combination with a low voltage high current motor for a battery powered vehicle.

12. A power controller according to claim 1 having a plurality of said switching circuits arranged around an inner area of the printed circuit board in a partial or complete loop, the inner area of the board and the outer area of the board outside the loop being substantially solid tracking areas forming the sole connections for electrical current to the switching circuits.

13. A power controller, having a plurality of switching circuits each comprising a first switching element, a second switching element, and a capacitor, and a printed circuit board having the switching circuits arranged around an inner area of the board in a partial or complete loop, the inner area of the board and the outer area of the board outside the loop being substantially solid tracking areas forming the sole connections for electrical current to the switching circuits.

14. A controller according to claim 13 wherein the inner area on both sides of the board and the outer area on at least one side form the connections to the switching circuits.

15. A controller according to claim 13 wherein the switching circuits are arranged in four sets, each set parallel to a respective edge of the board.

16. A controller according to claim 15 wherein the connectors to switching circuits are located substantially along a diagonal of the board.

17. A controller according to claim 16 wherein the connectors to the terminals of the second switching elements are located at opposite corners of the inner areas of the board.

18. A controller according to claim 13 wherein parts of at least one of the tracking areas adjacent to the switching circuits are divided by isolating lines into separate fingers for the respective switching circuits.

19. A controller according to claim 13 wherein the first and second switching elements are mounted adjacent each other on one face of the board and the capacitor is mounted on the other face of the board.

20. A controller according to claim 13 wherein each first switching element is a mosfet and each second switching element is a diode.

21. A controller according to claim 13 wherein all the switching elements are mosfets.

22. The controller as claimed in claim 13, in combination with a low voltage high current motor for a battery powered vehicle.

* * * * *